US012769217B2

(12) United States Patent
Schneider et al.

(10) Patent No.: US 12,769,217 B2
(45) Date of Patent: Oct. 20, 2026

(54) OPTICAL ELEMENT, AND ASSEMBLY AND OPTICAL SYSTEM THEREWITH

(71) Applicant: Carl Zeiss SMT GmbH, Oberkochen (DE)

(72) Inventors: Sonja Schneider, Oberkochen (DE); Norbert Wabra, Werneck (DE); Lukas Salfelder, Mutlangen (DE); Peter Graf, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 144 days.

(21) Appl. No.: 18/945,295

(22) Filed: Nov. 12, 2024

(65) Prior Publication Data

US 2025/0068089 A1 Feb. 27, 2025

Related U.S. Application Data

(63) Continuation of application No. PCT/EP2023/063692, filed on May 22, 2023.

(30) Foreign Application Priority Data

May 24, 2022 (DE) ......................... 102022205143.2

(51) Int. Cl.
*G03F 7/20* (2006.01)
*G02B 5/18* (2006.01)
(Continued)

(52) U.S. Cl.
CPC ....... *G03F 7/70941* (2013.01); *G02B 5/1876* (2013.01); *G02B 27/0043* (2013.01);
(Continued)

(58) Field of Classification Search
CPC ............. G03F 7/70941; G03F 7/70316; G03F 7/70825; G03F 7/70891; G02B 5/1876;
(Continued)

(56) References Cited

U.S. PATENT DOCUMENTS 4,733,945 A 3/1988 Bacich
6,097,536 A 8/2000 Bauer et al.
(Continued)

FOREIGN PATENT DOCUMENTS

DE 102017204619 A1 * 10/2017 ............. G02B 17/00
DE 102017211902 A1 8/2018
(Continued)

OTHER PUBLICATIONS

International Search Report and Written Opinion for corresponding PCT Appl No. PCT/EP2023/063692, dated Aug. 10, 2023.
(Continued)

*Primary Examiner* — Mesfin T Asfaw
(74) *Attorney, Agent, or Firm* — Fish & Richardson P.C.

(57) ABSTRACT

An optical element for incorporation into a holding device for forming an assembly for constructing an optical system comprises a body transparent to light from a used wavelength range, on which a first light passage surface and an opposing second light passage surface are formed. Each light passage surface has an optical used region for arrangement in a used beam path of the optical system and an edge region outside the optical used region and designated as an engagement region for holding elements of the holding device. Each light passage surface is of optical quality in the optical used region and has a surface shape designed in accordance with a used region specification specified by the function of the optical element in the used beam path. Light deflection structures with a geometrically defined surface design are in the edge region of at least one of the light passage surfaces.

20 Claims, 9 Drawing Sheets

(51) Int. Cl.
*G02B 27/00* (2006.01)
*G03F 7/00* (2006.01)

(52) U.S. Cl.
CPC ...... *G03F 7/70316* (2013.01); *G03F 7/70825* (2013.01); *G03F 7/70891* (2013.01)

(58) Field of Classification Search
CPC ........ G02B 27/0043; G02B 7/02; G02B 3/04; G02B 27/58
See application file for complete search history.

(56) References Cited

U.S. PATENT DOCUMENTS

| | | | |
|---|---|---|---|
| 9,097,984 | B2 | 8/2015 | Feldmann et al. |
| 2003/0234918 | A1 | 12/2003 | Watson |
| 2007/0154204 | A1 | 7/2007 | Lee |
| 2007/0165202 | A1 | 7/2007 | Koehler et al. |
| 2012/0224263 | A1 | 9/2012 | Gallagher |

FOREIGN PATENT DOCUMENTS

| | | | |
|---|---|---|---|
| JP | H11-202180 | A | 7/1999 |
| WO | WO 2005/026843 | A2 | 3/2005 |
| WO | WO 2006/128613 | A1 | 12/2006 |
| WO | WO 2013/047221 | A1 | 4/2013 |

OTHER PUBLICATIONS

German Office Action, with translation thereof, for corresponding DE Appl No. 10 2022 205 143.2, dated Oct. 11, 2022.

* cited by examiner

OPTICAL ELEMENT, AND ASSEMBLY AND OPTICAL SYSTEM THEREWITH

CROSS-REFERENCE TO RELATED APPLICATIONS

The present application is a continuation of, and claims benefit under 35 USC 120 to, international application No. PCT/EP2023/063692, filed May 22, 2023, which claims benefit under 35 USC 119 of German Application No. 10 2022 205 143.2, filed on May 24, 2022. The entire disclosure of each of these applications is incorporated by reference herein.

FIELD

The disclosure relates to an optical element for incorporation into a holding device for the purpose of forming an assembly for constructing an optical system of a microlithographic projection exposure apparatus, to an assembly comprising an optical element and a holding device for holding the optical element, and to an optical system having at least one such optical element. A field of application is that of optical imaging systems for constructing a microlithographic projection exposure apparatus, such as optical imaging systems in the form of dioptric or catadioptric microlithographic projection lenses.

BACKGROUND

These days, microlithographic projection exposure methods are predominantly used for producing semiconductor components and other finely structured components. Here, use is made of masks (photomasks, reticles), which carry or form the pattern of a structure to be imaged, for example a line pattern of a layer of a semiconductor component. In a projection exposure apparatus, the mask is positioned in the beam path between an illumination system and a projection lens so that the pattern is located in the region of the object plane of the projection lens. A substrate to be exposed, for example a semiconductor wafer coated with a radiation-sensitive layer (resist, photoresist), is held so that a radiation-sensitive surface of the substrate is arranged in the region of an image plane of the projection lens optically conjugate to the object plane. During an exposure procedure, the pattern is illuminated with the aid of the illumination system which forms, from the radiation of a primary radiation source, illumination radiation that is directed at the pattern, having specific illumination parameters, and incident on the pattern within an illumination field having a defined shape and size. The radiation modified by the pattern travels as projection radiation through the projection lens which images the pattern onto the substrate to be exposed, which is coated with a radiation-sensitive layer. Microlithographic projection exposure methods can also be used for the production of masks (reticles), for example.

One of the aims in the development of projection exposure apparatuses is to produce lithographically structures with smaller and smaller dimensions on the substrate. In the case of semiconductor components for example, smaller structures can lead to higher integration densities, which generally has a beneficial effect on the performance of the microstructured components produced. The size of the structures that can be produced depends generally on the resolving power of the utilized projection lens, and the latter can be increased, firstly, by reducing the wavelength of the projection radiation used for the projection and, secondly, by increasing the image-side numerical aperture NA of the projection lens used in the process.

Projection lenses are optical imaging systems which generally comprise a multiplicity of optical elements in order to meet partly conflicting desired properties with regard to the correction of imaging aberrations, possibly even in the case of large numerical apertures used. Both dioptric or refractive imaging systems and catadioptric imaging systems often have ten or more transparent optical elements in the field of microlithography.

Using holding devices, the optical elements are held at a defined positions along a used beam path of the optical system. In the case of imaging systems, the used beam path is usually referred to as imaging beam path. An optical element of an imaging system contributing to the imaging has an optical used region located in the imaging beam path and an edge region located outside of the optical used region. Refractive or reflective surfaces are prepared to optical quality in the optical used region. The surface shape is specified in accordance with the desired optical effect of the optical element by way of design parameters of the optical design of the imaging system, the specification typically being in the form of polynomial coefficients of a polynomial that defines the surface shape. In specification tables, the optical used region is frequently also referred to as “clear optical diameter” or “clear aperture” of the optical element. Optical quality need not be attained in the edge region. When assembling assemblies with lens elements and other transparent optical elements, holding elements of the holding device assigned to the optical element typically engage on the edge region. A corresponding statement applies to optical elements in the illumination systems, where the used beam path is frequently referred to as illumination beam path.

Different options have been proposed for fixing the optical element to the holding elements. The patent application US 2003/0234918 A1 discloses examples of clamping mount technology, in which an optical element is held by resilient holding elements in the edge region (soft mount). In other holding devices, elastic holding elements of a holding device are adhesively bonded to the optical elements in the region of the respectively assigned contact zone by way of an adhesive layer. Examples of the adhesive bonding technology are disclosed in U.S. Pat. No. 4,733,945 or U.S. Pat. No. 6,097,536.

In practice, the radiation often reaches the image plane from the object not only along the imaging beam path, which is desired for the imaging, in the case of optical imaging systems with a complex structure; instead, portions of radiation which do not contribute to the imaging but possibly interfere with, or cause a deterioration of, the latter may also arise. For example, what is known as “superaperture light” may lead to a deterioration in the imaging quality in the case of projection exposure methods. In this context, the term “superaperture light” denotes light which is diffracted by the structure-giving mask and emitted at an angle greater than the object-side aperture angle used for the imaging, the object-side aperture angle in turn being determined by the current diameter of the aperture stop bounding the imaging beam path. Superaperture light does not contribute directly to the imaging as it cannot reach the image plane through the aperture stop. However, it heats the optical elements located between the mask and the aperture stop. A consequence of this heating is a change in the refractive index and lens element shape, with the result that there is a disturbance in the wavefront contributing to the image generation. As an alternative or in addition, scattered light may also be generated, the latter generally reducing the contrast of the generated image should it reach the image plane. In this case, the term "scattered light" denotes, inter alia, light which may arise for example as a result of residual reflections at the surfaces of transparent optical elements coated with an antireflection coating, at the back sides of mirrors and/or at other locations in the region of the imaging beam path. These unwanted portions of light at the wavelength designated for the imaging, for example the scattered light and the superaperture light, are also referred to as "stray light" within the scope of this application, independently of their cause.

In addition to intrinsic imaging aberrations that a projection lens may have on account of its optical design and production, imaging aberrations may also occur during the use period, for example during the operation of a projection exposure apparatus at the user. The cause of such imaging aberrations is often found in changes in the optical elements used in the projection lens, which are caused by the radiation employed during use. By way of example, some of this radiation can be absorbed by the optical elements in the projection lens. The extent of the absorption depends, inter alia, on the material used in the optical elements, for example the lens element material, the mirror material, and/or on the properties of possibly provided antireflection coatings or reflection coatings. The absorption of the projection radiation may lead to heating of the optical elements, as a result of which a surface deformation may be caused in the optical elements and, in the case of refractive elements, a change in refractive index may be caused directly and indirectly via thermally caused mechanical stresses. Changes in refractive index and surface deformations in turn can lead to changes in the imaging properties of the individual optical elements, and hence also to changes in the projection lens overall. This topic is often dealt with under the heading "lens heating".

The illumination system may also experience drops in performance on account of light propagating outside of the illumination beam path.

To improve the customer's benefits of high-performance microlithographic optics systems, throughput increases for projection exposure apparatuses can be provided within the scope of the roadmap for the lithography with deep ultraviolet (DUV) radiation. On account of the higher light intensity typically used in this case, an increase in the throughput is expected to lead to increased "lens heating" effects. However, in general, substantial increases in lens heating effects are hardly acceptable in the case of unchanging or even more stringent desired properties in lithography.

SUMMARY

The disclosure seeks to provide measures which are able to contribute to the avoidance of the undesirable effects of "lens heating" effects where possible or to a restriction thereof to an uncritical level, even in the case of increased light intensities.

According to an aspect, the disclosure provides an optical element for incorporation into a holding device, with the optical element in the incorporated state jointly forming an assembly with the holding device. The assembly serves to construct an optical system, for example a projection lens or another imaging system, for a microlithographic projection exposure apparatus. Such an optical system typically comprises a multiplicity of assemblies with optical elements held thereby, which in the assembled state jointly define a used beam path, the latter also referred to as imaging beam path in the case of imaging systems.

The optical element has a transparent body formed of a material which has a high transmission for, or is transparent to, light from a used wavelength range. For example, the material can be synthetic fused silica or a fluoride crystal material, for example calcium fluoride. Light passage surfaces are formed on opposite sides of the transparent body, namely a first light passage surface and a second light passage surface opposite thereto. If light passes through the optical element, then one of the light passage surfaces serves as a light entrance surface and the other serves as a light exit surface.

For example, the optical element can be a lens element with positive or negative refractive power, or a plane-parallel plate with more or less no refractive power.

Each of the light passage surfaces has an optical used region and an edge region located outside of the optical used region. In the incorporated state, the optical used region is provided for arrangement within the used beam path of the optical system The edge region is provided as engagement region for holding elements of the holding device. In the assembled state, these may engage on the edge region in the region of contact zones. The optical used region can be used without impairment by holding elements of the holding device. Each of the light passage surfaces is prepared to optical quality in the optical used region, meaning inter alia that practically no surface roughness interfering with the light passage is present. The surface shape in the optical used region is designed according to a specified used region specification, the latter emerging from the desired optical effect or function of the optical element in the used beam path and being accordingly specified by what is known as the optical design.

In general, the surface shape of the optical used region continues beyond the region boundary between the optical used region and the edge region, without however particularly stringent properties being placed on the surface quality anymore. Occasionally, a portion of the edge region close to the used region may still have more or less optical quality as a result of an overshoot of the polishing tools, but this quality reduces with increasing distance from the region boundary between the used region and the edge region.

In the case of an optical element, (one or more) light deflection structures with a geometrically defined surface design, which is designed in accordance with an edge region specification which deviates from the used region specification, are formed in the edge region of at least one of the light passage surfaces. The light deflection structures or their surface design are/is configured to deflect into a target region outside of the used beam path and specifiable by the edge region specification the portions of light which were deflected or re-routed by the light deflection structures.

This aspect is partly based on the idea that the portions of light which propagate outside of the used beam path during the operation of the optical system and which may be incident on a light passage surface in the edge region are largely not incident from arbitrary or randomly arising directions of incidence. Instead, on account of the structure of the optical system, it is possible for the majority of stray light to calculate the direction of incidence and the location at which the stray light is able to be incident on the edge region. For example, this predictability arises for portions of stray light that arise as a result of even highly effective antireflection coatings having, at least for certain directions of incidence of the radiation, a residual reflectivity sufficient to reflect a portion of the incident light, to be precise in predictable exit directions.

The inventors have recognized that an additional benefit for the operation of the optical system can be obtained hereby with the aid of the defined structuring of the edge region. To wit, if a light deflection structure with a geometrically defined surface design, which may be specified by way of the edge region specification, is provided, then it is possible to fully deflect, or at least deflect the majority of, the incident stray light into specifiable target regions outside of the used beam path in targeted fashion by way of refraction and/or diffraction and/or reflection.

Consequently, it is possible with the aid of suitable edge region specifications to steer in a targeted manner the stray light, which was previously considered a source of interference and uncontrollable, and hence use the stray light for the purpose of improving the performance of the optical system.

The light deflection structures can comprise refractive and/or diffractive light deflection structures. Consequently, the deflection by the light deflection structures can be achieved in this case by light refraction (refraction), by light diffraction (diffraction) or by a combination of diffraction and refraction. In part, such light deflection structures can be created without much outlay during the production of the optical element, for example in one piece with the remainder of the optical element. In some cases, reflective light deflection structures may also be provided, wherein the option exists even in the case of reflective light deflection structures of combining these with a refractive and/or diffractive light deflection structure or of using these exclusively as mirroring (reflective) light deflection structures.

There are different options of "using" the deflected stray light. One option involves placing the target region in such a way that the stray light influenced by the light deflection structures is steered into a region non-critical to the performance of the optical system and for example is incident there on an absorbing structure which absorbs the stray light and consequently renders it harmless in relation to the function of the optical system.

In the case of an assembled assembly with a holding device and a held optical element, the holding device comprises holding elements which engage in the region of a contact zone in the edge region. The contact zone is the region in which there is direct or indirect mechanical contact between the holding element and the optical element. Should stray light be incident in the region of the contact zone, this may lead to the contact zone heating and hence lead to possible undesired lens heating effects. In the case of a clamping hold, these may arise for example by virtue of the holding elements being heated directly by the stray light and the heat that arises being transferred through the contact region into the material of the optical element. In the case of assemblies in which holding elements of the holding device are adhesively bonded to the optical elements in the region of the respectively assigned contact zones, the adhesive material may be heated by the effect of stray light and may thus lead indirectly to lens heating effects. Provided an adhesive protection layer for protecting the curable adhesive from impairment by light at the used wavelength is provided in the region of the contact zone, local heating may alternatively or additionally arise in the region of the contact zones as a result of absorption effects in the adhesive protection layer. Such issues may be avoided or significantly reduced when the disclosure is applied if the light deflection structure is designed so that deflected portions of light are deflected into a target region outside of the contact zones.

The targeted deflection of stray light into specifiable target regions also makes it possible to obtain an improvement in the performance of the imaging system by virtue of the components of the stray light intensity deflected into a target region being used in targeted fashion to heat a component positioned there in order to obtain a thermally induced manipulation within the optical system, such as within an imaging system.

A use of this approach can be understood as follows. The distribution of stray light in position space and in angle space and the intensity distribution of the stray light within the distribution generally depends not only on the optical design of the optical system but also on the type of use during productive operation. For example, the stray light distribution in a projection lens of a projection exposure apparatus generally depends on the mask structure of the mask (reticle) used for the imaging. Alternatively or additionally, the stray light distribution may also depend on the manner in which the mask is illuminated, which is to say it may depend on what is known as the illumination setting. Thus, coherent illumination settings with a specifiable sigma value (on-axis illumination) result in significantly different stray light distributions from off-axis illuminations such as dipole illumination settings, for example, in which the mask is predominantly illuminated from two directions obliquely opposite one another.

What is more, the stray light distribution and the used light distribution are generally influenced by the shape and position of the (effective) image field. The latter may have a rectangular shape or an arcuately curved shape ("ring field"). The image field may be centred with respect to the optical axis ("on-axis field") or may be located off centre therefrom outside of the optical axis ("off-axis field").

The spatial distribution of the stray light intensity in the optical system can be calculated for typical combinations of mask structures and illumination settings. Now, the stray light may be deflected by the light deflection structures so that a thermally activated manipulator is created, the latter being designed so that its effect counteracts disadvantageous effects of lens heating in the region of the used beam path and thus is able to at least partly compensate these.

Such thermally activatable manipulators are passive, which is to say they have no dedicated drives or actuators. They are "controlled" by stray light that has been deflected in a targeted manner.

Further features and aspects of the disclosure are evident from the claims and from the description of exemplary embodiments of the disclosure, which will be explained below with reference to the figures.

DETAILED DESCRIPTION OF THE EXEMPLARY EMBODIMENTS

Figure 1:
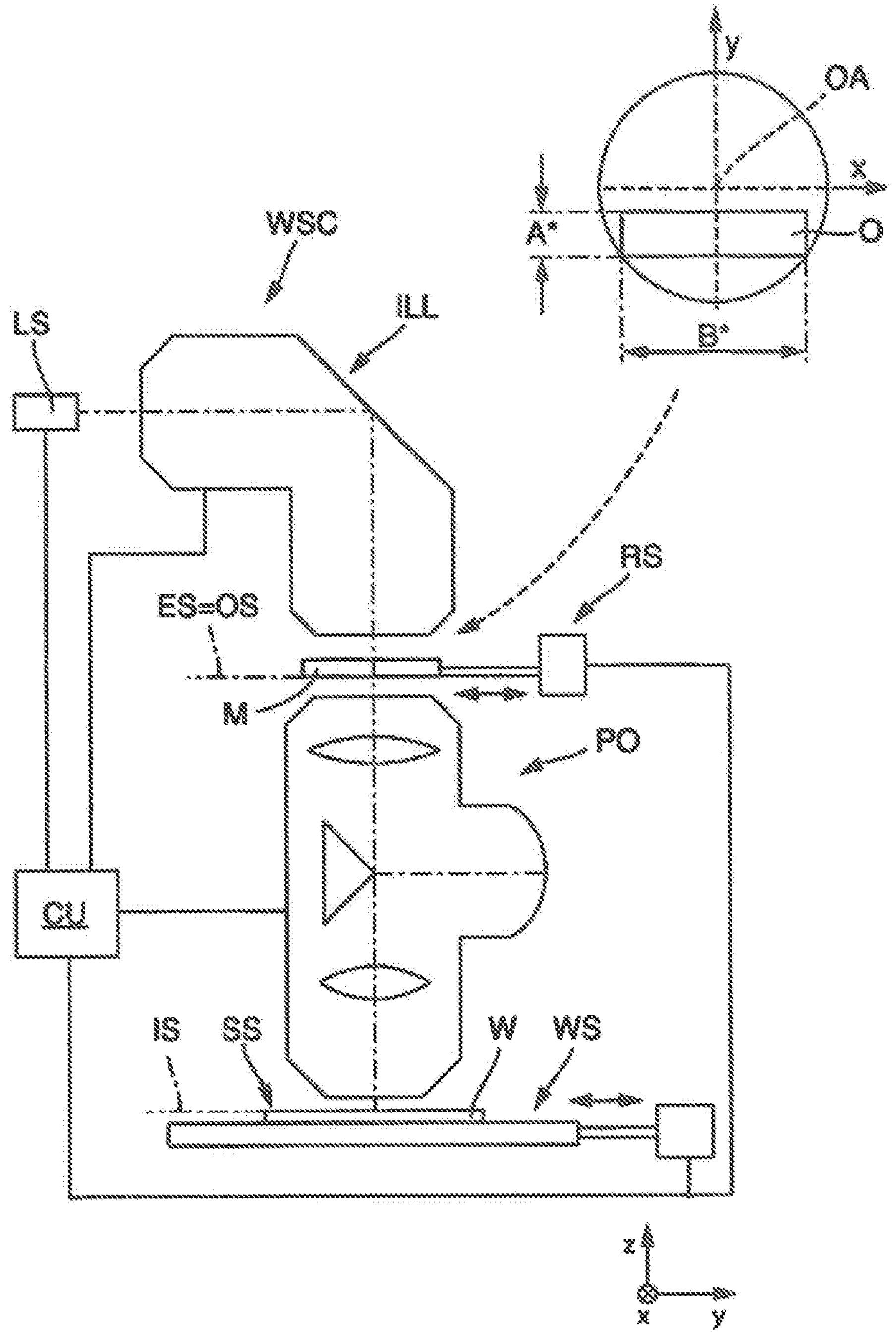
FIG. 1 shows an exemplary embodiment of a microlithographic projection exposure apparatus.

FIG. 1 shows an example of a microlithographic projection exposure apparatus WSC, which is utilizable in the production of semiconductor components and other finely structured components and which operates with light or electromagnetic radiation from the deep ultraviolet (DUV) range in order to obtain resolutions down to fractions of micrometres. An ArF excimer laser with an operating wavelength $\lambda$ of approximately 193 nm serves as primary radiation source or light source LS. Other UV laser light sources, for example $F_2$ lasers with an operating wavelength of 157 nm or ArF excimer lasers with an operating wavelength of 248 nm, are also possible.

At its exit surface ES, an illumination system ILL disposed downstream of the light source LS generates a large, sharply delimited and substantially homogeneously illuminated illumination field, which is adapted to the desired telecentricity of the projection lens PO arranged downstream thereof in the light path. The illumination system ILL has devices for setting different illumination modes (illumination settings) and, for example, can be switched between conventional on-axis illumination with different degrees of coherence $\sigma$ and off-axis illumination. By way of example, the off-axis illumination modes comprise annular illumination or dipole illumination or quadrupole illumination or any other multi-polar illumination. The design of suitable illumination systems is known per se and therefore not explained in any more detail here. The patent application US 2007/0165202 A1 (corresponding to WO 2005/026843 A2) shows examples of illumination systems which can be used within the scope of various embodiments.

Those optical components which receive the light from the laser LS and form illumination radiation from the light, which illumination radiation is directed to the reticle M, are part of the illumination system ILL of the projection exposure apparatus.

Arranged downstream of the illumination system is a device RS for holding and manipulating the mask M (reticle) in such a way that the pattern arranged at the reticle lies in the object plane OS of the projection lens PO, which coincides with the exit plane ES of the illumination system and which is also referred to here as reticle plane OS. For the purposes of a scanning operation, the mask is movable in this plane in a scanning direction (y-direction) perpendicular to the optical axis OA (z-direction) with the aid of a scanner drive.

Following downstream of the reticle plane OS is the projection lens PO, which acts as a reduction lens and images an image of the pattern arranged at the mask M with a reduced scale, for example with the scale of 1:4 ($|\beta|=0.25$) or 1:5 ($|\beta|=0.20$), onto a substrate W coated with a photoresist layer, the light-sensitive substrate surface SS of which lies in the region of the image plane IS of the projection lens PO.

The substrate to be exposed, which is a semiconductor wafer W in the exemplary case, is held by a device WS which comprises a scanner drive in order to move the wafer synchronously with the reticle M perpendicular to the optical axis OA in a scanning direction (y-direction). The device WS, which is also referred to as "wafer stage," and the device RS, which is also referred to as "reticle stage," are constituent parts of a scanner device which is controlled by way of a scan control device which, in the embodiment, is integrated in the central control device CU of the projection exposure apparatus.

The illumination field generated by the illumination system ILL defines the effective object field OF used during the projection exposure. In the exemplary case, the latter is rectangular, it has a height A* measured parallel to the scanning direction (y-direction) and it has a width B*>A* measured perpendicular thereto (in the x-direction). In general, the aspect ratio AR=B*/A* lies between 2 and 10, such as between 3 and 8. The effective object field lies at a distance next to the optical axis in the y-direction (off-axis field). The effective image field IF in the image surface IS, which is optically conjugate to the effective object field, has the same form and the same aspect ratio between the height B and width A as the effective object field, but the absolute field dimension is reduced by the imaging scale $\beta$ of the projection lens, which is to say $A=|\beta|A^*$ and $B=|\beta|B^*$.

If the projection lens is designed and operated as an immersion lens, then radiation is transmitted through a thin layer of an immersion liquid during the operation of the projection lens, which thin layer is situated between the exit surface of the projection lens and the image plane IS. Image-side numerical apertures NA>1 are possible during the immersion operation. A configuration as a dry lens is also possible; in this case, the image-side numerical aperture is restricted to values NA<1.

Figure 2:
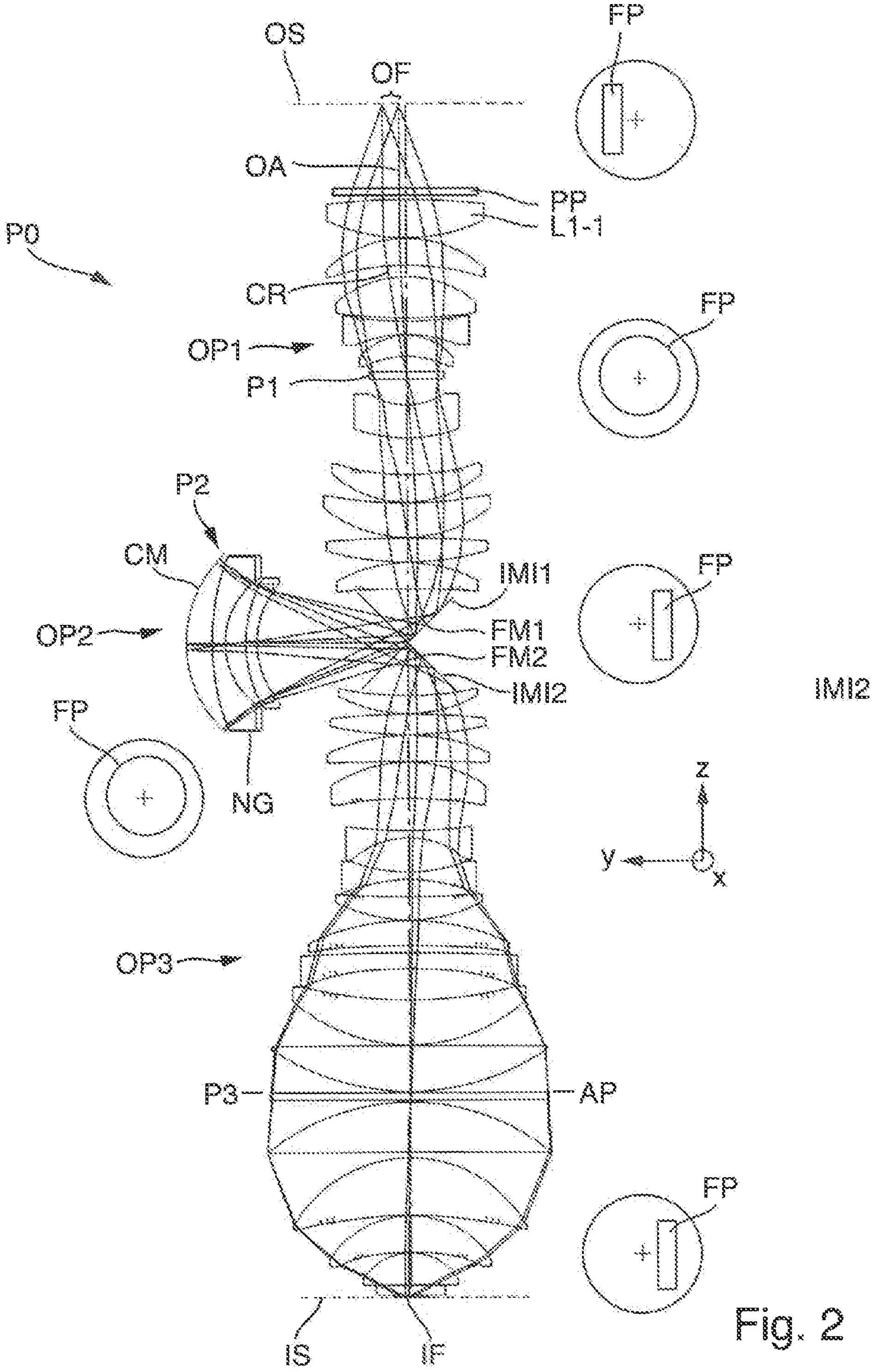
FIG. 2 shows a schematic lens element sectional view of an embodiment of a catadioptric projection lens with, shown next to it, footprints for illustrating the used beam path.

FIG. 2 shows a schematic meridional lens element sectional view of an embodiment of a catadioptric projection lens PO with selected beams for elucidating the imaging beam path of the projection radiation passing through the projection lens during operation. The projection lens is provided as an imaging system with a reducing effect, for imaging, with a reduced scale, for example with the scale of 4:1, a pattern of a mask arranged in its object plane OS onto its image plane IS aligned parallel to the object plane. Here, exactly two real intermediate images IMI1, IMI2 are produced between the object plane and image plane. A first lens part OP1, which is constructed exclusively with transparent optical elements and is therefore refractive (dioptric), is designed in such a way that the pattern of the object plane is imaged into the first intermediate image IMI1 substantially without any change in size. A second, catadioptric lens part OP2 images the first intermediate image IMI1 onto the second intermediate image IMI2 substantially without any change in size. A third, refractive lens part OP3 is designed to image the second intermediate image IMI2 with great reduction into the image plane IS.

Pupil surfaces or pupil planes P1, P2, P3 of the imaging system lie between the object plane and the first intermediate image, between the first and the second intermediate image, and between the second intermediate image and the image plane, respectively, where the chief ray CR of the optical imaging intersects the optical axis OA. The aperture stop AS of the system can be attached in the region of the pupil surface P3 of the third lens part OP3. The pupil surface P2 within the catadioptric second lens part OP2 lies in immediate proximity to a concave mirror CM.

The catadioptric second lens part OP2 contains the sole concave mirror CM of the projection lens. A negative group NG having two negative lens elements is situated directly upstream of the concave mirror. In this arrangement, which is occasionally referred to as a Schupmann achromate, the Petzval correction, which is to say the correction of the image field curvature, is achieved as a result of the curvature of the concave mirror and the negative lens elements in the vicinity thereof, the chromatic correction as a result of the refractive power of the negative lens elements upstream of the concave mirror and also the stop position with respect to the concave mirror.

A reflective deflection device serves to separate the beam passing from the object plane OS to the concave mirror CM or the corresponding partial beam path from that beam or partial beam path which, after reflection at the concave mirror, passes between the latter and the image plane IS. For this purpose, the deflection device has a plane first deflection mirror FM1 having a first mirror surface MS1 for reflecting the radiation coming from the object plane to the concave mirror CM and a plane second deflection mirror FM2 aligned at right angles to the first deflection mirror FM1 and having a second mirror surface MS2, wherein the second deflection mirror deflects the radiation reflected from the concave mirror in the direction of the image plane IS. Since the optical axis is folded at the deflection mirrors, in this application the deflection mirrors are also referred to as folding mirrors. The deflection mirrors are tilted relative to the optical axis OA of the projection lens about tilt axes extending perpendicularly to the optical axis and parallel to a first direction (x-direction), for example by 45°. When configuring the projection lens for the scanning operation, the first direction (x-direction) is perpendicular to the scanning direction (y-direction) and thus perpendicular to the movement direction of the mask (reticle) and substrate (wafer). For this purpose, the deflection device is realized by a prism whose externally reflectively coated cathetus surfaces aligned perpendicularly to one another serve as deflection mirrors.

The intermediate images IMI1, IMI2 each lie in optical proximity to the folding mirrors FM1 and FM2, respectively, closest to them, but can be at a minimum optical distance from them, such that possible defects on the mirror surfaces are not sharply imaged into the image plane, and the plane deflection mirrors (plane mirrors) FM1, FM2 lie in the region of moderate radiation energy density.

The positions of the (paraxial) intermediate images define field planes of the system which are optically conjugate to the object plane and to the image plane, respectively. The deflection mirrors thus lie in optical proximity to field planes of the system, which is also referred to as "near field" in the context of this application. In this case, the first deflection mirror is arranged in optical proximity to a first field plane, belonging to the first intermediate image IMI1, and the second deflection mirror is arranged in optical proximity to a second field plane, optically conjugate to the first field plane and belonging to the second intermediate image IMI2.

The optical proximity or the optical distance of an optical surface with respect to a reference plane (for example, a field plane or a pupil plane) is described by the so-called subaperture ratio SAR in this application. For the purposes of this application, the subaperture ratio SAR of an optical surface is defined as follows:

$$SAR = \text{sign}\, h(|r|/(|h|+|r|))$$

where r denotes the marginal ray height, h denotes the chief ray height and the signum function sign x denotes the sign of x, with sign 0=1 according to convention. The chief ray height is understood to mean the ray height of the chief ray of a field point of the object field with a maximum field height in terms of magnitude. The ray height should be understood to be signed. The marginal ray height is understood to mean the ray height of a ray with a maximum aperture proceeding from the point of intersection between the optical axis and the object plane. This field point need not contribute to transferring the pattern arranged in the object plane—for example in the case of off-axis image fields.

The subaperture ratio is a signed variable which is a measure of the field or pupil proximity to a plane in the beam path. By definition, the subaperture ratio is normalized to values between −1 and +1, wherein the subaperture ratio is zero in each field plane and wherein the subaperture ratio jumps from −1 to +1, or vice versa, in a pupil plane. Therefore, a subaperture ratio with an absolute value of 1 determines a pupil plane.

An optical surface or a plane is then designated as "(optically) near" an optical reference surface if the subaperture ratios of these two surfaces are comparable in terms of numerical value.

For example, an optical surface or a plane is designated "(optically) near field" if it has a subaperture ratio that is close to 0. An optical surface or a plane is designated as "(optically) near pupil" if it has a subaperture ratio that is close to 1 in terms of absolute value.

The used beam path of the projection lens, which is also referred to as the imaging beam path or projection beam path, runs from the effective object field OF to the effective image field IF. The used beam path is a volume in three-dimensional space ("subset of $R^3$") which is defined in that each point in the space has running through it at least one continuous ray from the object field OF within the object-side use aperture to the image field IF within the image-side use aperture. Shape and position of the imaging beam path during a process generally depend on the current field size and the orders of diffraction.

The region of an optical surface illuminated by the rays of the projection beam path coming from the effective object field OF is also referred to as "footprint" in this application. Here, the footprint of the projection radiation on an optical surface represents the size and shape of the intersection between the projection beam and the surface illuminated by the projection beam. Next to the lens element section, FIG. 2 schematically shows footprints FP at different positions along the projection beam path. The optical vicinity to a closest field plane is identifiable by virtue of the footprint substantially having the rectangular form of the effective object field OF, with the edge regions being slightly rounded (see, for example, near lens element L1-1 or on the deflection mirrors in the vicinity of the intermediate images). The footprint lies outside of the optical axis OA, just like the object field. By contrast, a substantially circular region is illuminated in the region of a pupil plane which is Fourier transformed with respect to a field plane, with the result that a footprint in the region of a pupil has at least approximately a circular form (see at P1 in the refractive first lens part OP1 or at P2 in the optical vicinity of the concave mirror CM). The footprints may provide information, inter alia, about the spatial distribution of the radiation-induced heating.

During operation, there usually are rays that are not part of the used beam path. These include, inter alia, what are known as "superaperture rays." In this context, these are understood to mean those rays which are diffracted by the structure-giving mask and emitted at an angle greater than the object-side aperture angle used for the imaging, the object-side aperture angle being determined by the current diameter of the aperture stop bounding the projection beam path. This object-side aperture angle defines the object-side use aperture. A corresponding statement applies to the image side, which is to say the side of the image optically conjugate to the object.

Figure 3A:
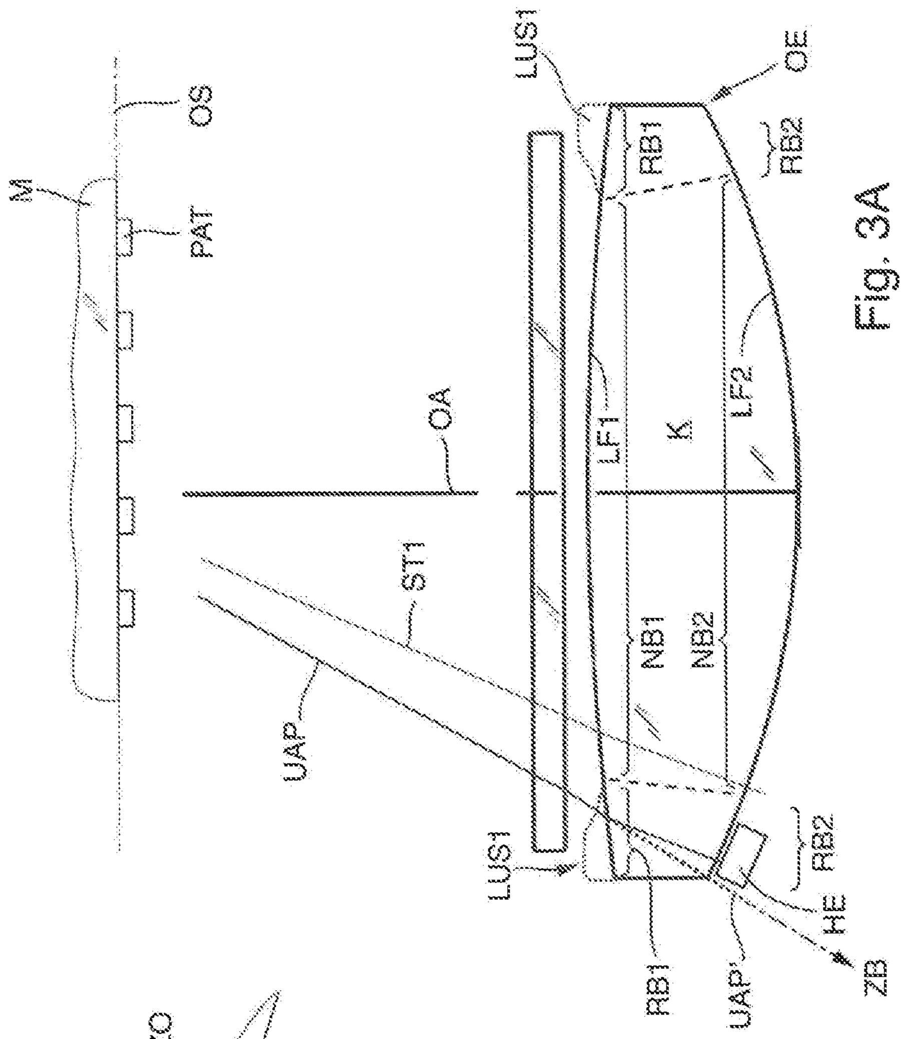
FIGS. 3A and 3B show a magnified portion of the projection lens of FIG. 2 from the region directly behind the object plane OS in FIG. 3A and show a magnified detail in the region of a contact zone between a holding element and the lens element in FIG. 3B.

For the further explanation of some of the issues are considered in this application and the solution thereof, FIG. 3A shows a magnified portion of the projection lens of FIG. 2 from the region immediately behind the object plane OS, in which a mask M with a structure PAT to be imaged is situated during operation. Shown are the plane-parallel plate PP (optical element without refractive power) immediately following the object plane and the lens element L1-1, which immediately follows this plane-parallel plate and which, as part of the projection lens, is the first transparent optical element with refractive power that is closest to the object. In general, the reference sign OE should designate an optical element.

The lens element L1-1 has a body K (e.g., made of synthetic fused silica) transparent to ultraviolet light and is formed as a relatively thick biconvex lens element with a first light passage surface LF1 facing the object plane (light entrance surface LF1) and an opposite second light passage surface (LF2) (light exit surface LF2).

The lens element fulfils its assigned optical function in the beam path to the best possible extent under all use conditions. Therefore, each of the light passage surfaces LF1, LF2 has an optical used region NB1, NB2, which includes the region of the optical axis and which extends radially outward therefrom to such an extent that all rays of the projection beam path pass through the optical used region on both the entrance side and the exit side under all operating conditions. A ray ST1 propagating at the edge of the projection beam is depicted. Each of the lens element surfaces has radially outside of the optical used region an edge region RB1, RB2 which encloses the respective optical used region in ring-shaped fashion.

In the incorporated state, the optical element or the lens element L1-1 is carried by a holding device or a mount comprising a few holding elements HE which are distributed over the circumference of the lens element and on which the lens element rests in the case of a perpendicularly oriented projection lens. Together with the lens element mounted or held therein, the mount or holding device forms an assembly BG which, together with further assemblies containing other optical elements, forms the projection lens.

The contact zones KZO between the holding element and the exit-side light passage surface LF2 are located in azimuthally distributed fashion in the edge region of the lens element and are each in contact with the lens element in the region of a contact zone KZO. It is evident from the magnified detail of the region of the contact zone KZO in FIG. 3B that the lens element, by way of its light exit side LF2, is adhesively bonded to the holding element HE. The region of the adhesive connection has multi-layer construction. An adhesive layer KL formed of an adhesive material is applied to the support surface of the holding element. An adhesive protection layer KSS disposed between the adhesive layer and the light exit surface LF2 was applied to the edge region of the light exit side LF2 before the adhesive connection was established in the region of the contact zone. The UV radiation-absorbing adhesive protection layer protects the adjacent adhesive layer KL from UV radiation, which could reach the adhesive layer through the lens element in the edge region, and therefore improves the service life of the adhesive connection.

Each of the light passage surfaces is prepared to optical quality in the optical used region NB1, NB2 and has a surface shape designed in accordance with a used region specification. The used region specification in turn is specified by the function of the optical element in the used beam path. It is defined within the scope of calculating the optical design. In the exemplary case, both lens element surfaces LF1, LF2 are spherically curved in the used region.

By contrast, the intention is for the edge regions RB1, RB2 not to contribute to the imaging. Although the surface shape in the edge region still corresponds to the mathematical continuation of the surface shape in the used region in the case of conventional lens elements, the optical surface is however substantially rougher, at least in a region at a radial distance from the transition between used region and edge region (dashed lines), and of optically poorer quality in this respect since these surface portions are not required for the imaging.

A peculiarity of this optical element L1-1 relates to the effect thereof on rays running outside of the projection beam path and striking the edge region radially outside of the optical used region. FIG. 3A depicts what is known as a superaperture ray UAP, propagating in which is light that was deflected by the structure-giving mask M and emitted at an angle that is greater than the object-side aperture angle used for the imaging. The latter in turn is specified by the diameter of the aperture stop.

Figure 3B:
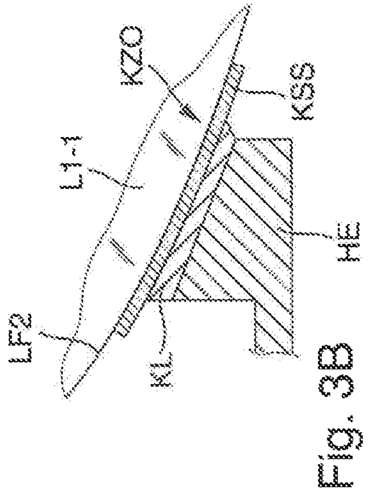

The solid line in FIGS. 3A and 3B shows the course of a superaperture array UAP which penetrates through the light passage surface LF1 into the lens element material in the entrance-side edge region RB1, passes through the lens element material and reaches the region of the contact zone KZO through the light passage surface LF2 at the light exit side.

The radiant energy is absorbed by the adhesive protection layer KSS, which can lead to heating of the adjacent lens element and adjacent holding element, and optionally to heating of the adjacent region of the mount. Unwanted lens heating effects may arise due to this locally arising heat.

In the illustrated embodiment, this issue is avoided by virtue of the edge region of the entrance-side light passage surface LF1 not being a simple extrapolation of the surface shape of the light entrance side in the used region but instead being imparted with a geometrically defined surface design during the manufacturing, the edge region being designed according to an edge region specification that deviates from the used region specification. In the exemplary case, the specified shaping of the light entrance surface in the edge region RB1 at the light entrance side is chosen so that the entrance-side edge region RB1 is provided with a rotationally symmetric aspherical surface shape. The latter emerges smoothly or continuously, which is to say without edges or jumps, from the surface shape of the used region in the transition region between used region and edge region but deviates significantly in the edge region from the mathematical continuation of the used region, which is depicted by the dashed lines.

In the exemplary case, the entrance-side light passage surface LF1 is convexly spherically curved in the optical used region, and, as the distance from the optical axis increases, the convex curvature turns into a narrow region with concave curvature in the edge region following a point of inflection, before a convex curvature is present again even further out. This creates a refractive light deflection structure LUS1 which ensures that the superaperture light UAP deflected by diffraction reaches a target region ZB outside of the used beam path, the target region being specifiable by the edge region specification. In the present case, the target region is defined such that it is located (radially) outside of the contact zones KZO. In other words: The contact zones are protected from superaperture rays by the refractive light deflection structure LUS1 by virtue of the superaperture rays being deflected past the contact zones on the outside and into non-critical regions outside of the contact zone, which is illustrated by the broken superaperture ray UAP' drawn using dashed lines.

The target region ZB where the deflected superaperture light is incident having circumvented the contact zone should be quite massive or have quite a lot of mass in order to be subject to only small temperature changes in the case of radiation being incident. Moreover, the region should have a good thermal connection to the outside so that the heat does not flow back into the lens element via the holding elements.

The targeted deflection of superaperture light via an asphere in the edge region of a lens element on the light-entrance side thereof can be realized relatively easily from a manufacturing point of view since the rotationally symmetric asphere (the light deflection structure LUS1) can be manufactured in one work step together with the rotationally symmetric design in the optical used region.

In the example of FIG. 3A, the light deflection structure LUS1 has a continuously curved surface shape in the entire edge region, the surface shape having a negative radius of curvature in at least one region, in which the centre of curvature is thus located on the light entrance side. This creates a diverging function or a ring-shaped circumferential diverging lens element or diverging zone.

An alternative option for designing a refractive light deflection structure for the purpose of deflecting superaperture light can be achieved by virtue of the light deflection structure having Fresnel lens rings in the edge region. The asphere in the edge region can thus be embodied as a ring-shaped Fresnel lens element, as a result of which installation space can be saved in comparison with the more massive asphere in FIG. 3A.

In the exemplary embodiments explained hereinafter, the same reference signs as in FIG. 3A are used in part for the same or similar features for reasons of clarity. In respect of the arrangement and basic shape of the lens element L1-1, reference is made to the example above.

Figure 4B:
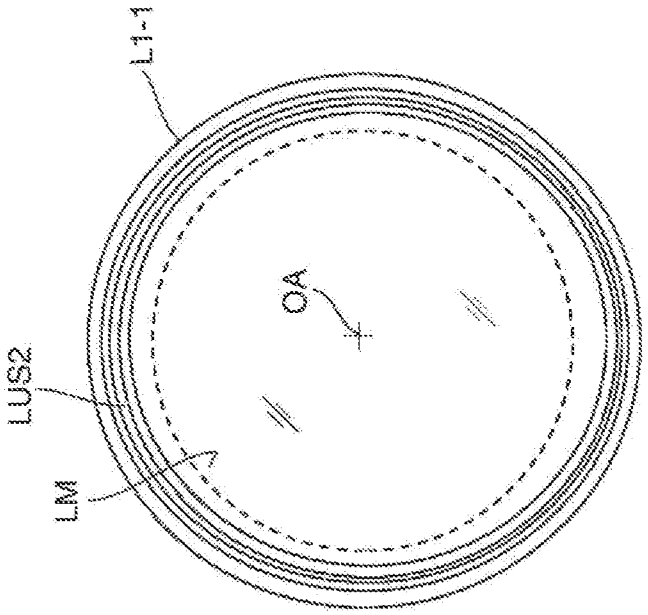
FIGS. 4A and 4B show an exemplary embodiment in which a deflection of superaperture light is achieved by diffraction with the aid of diffractive light deflection structures in the edge region of the lens element.
Figure 4A:
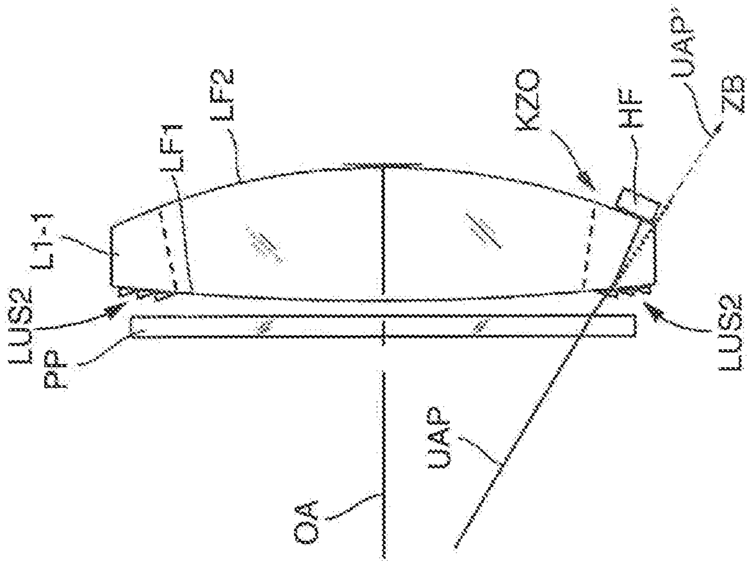

FIGS. 4A and 4B show an exemplary embodiment in which a deflection of superaperture light is achieved by diffraction with the aid of light deflection structures LUS2 in the form of diffractive structures in the edge region of the lens element. In this respect, FIG. 4A shows a meridional section analogous to FIG. 3A, while FIG. 4B shows the lens element top side facing the object plane (first light passage surface LF1) in a plan view. The diffractive light deflection structure LUS2 is formed by a diffraction grating which has circular diffractive structures and is formed rotationally symmetrically with respect to the optical axis, with the result that the diffraction of incident radiation is brought about predominantly outwardly in the radial direction in each case. In the exemplary case, the light deflection structure LUS2 has blazed grating with a diffractive effect for light at the used wavelength. As is quite evident from FIG. 4A, this has in cross section rings designed to be sawtooth-shaped. The radial spacing thereof and the angles of the faces of the saw teeth are matched to one another such that the diffraction efficiency at the used wavelength is at a maximum for a certain order of diffraction. The majority of the intensity component of the narrowband projection radiation light is thus concentrated in a single desired order of diffraction, with hardly any intensity remaining in the other orders, especially not in the zeroth order of diffraction, which is to say during the straight passage through the diffraction grating. The desired deflection angle can be set very exactly in this way and the light intensity of the deflected superaperture ray UAP' is concentrated in only a narrow target region ZB, which may be advantageous especially in the case of complicated installation situations. Here, too, the light deflection structure is designed so that deflected stray light is re-routed and no stray light strikes the contact zones KZO. Within the scope of manufacturing of the lens element, the rotationally symmetric blazed grating can be manufactured at the same time and from the same material as the lens element.

The creation of light deflection structures which are rotationally symmetric with respect to the optical axis of the optical element may be advantageous for manufacturing reasons, but this is unnecessary or may be undesirable for functional reasons in many cases. Hence, there are exemplary embodiments in which the optically effective surface shape of the edge region is not rotationally symmetric with respect to the optical axis. For example, the surface shape may have an n-fold rotational symmetry in relation to the optical axis in the edge region, where n may be 2, 3, 4, 6 or 8, for example. A few examples are explained hereinafter.

Figure 5B:
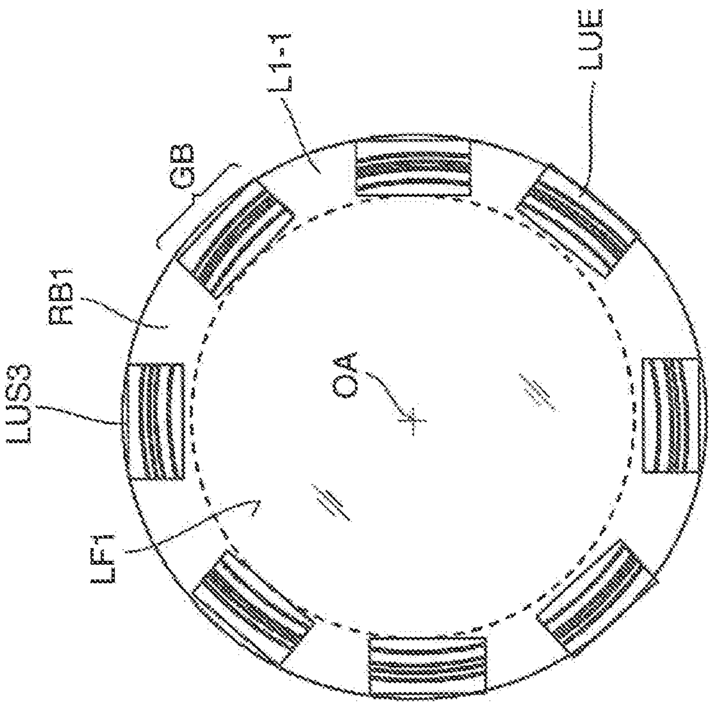
FIGS. 5A and 5B show a meridional section (FIG. 5A) and a plan view of the lens element top side (FIG. 5B) of an exemplary embodiment with azimuthally structured diffractive structures in the edge region.
Figure 5A:
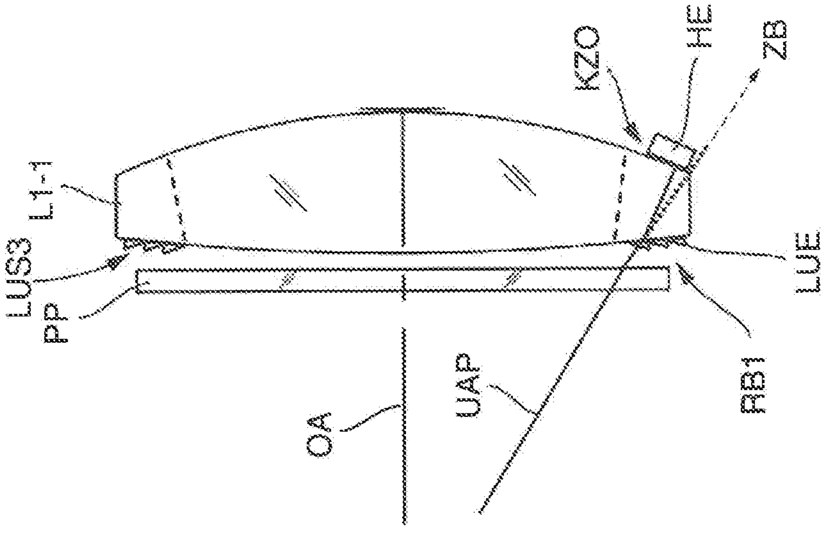

FIGS. 5A and 5B show a meridional section (5A) and a plan view of the lens element top side (FIG. 5B) of an exemplary embodiment in which the deflection of superaperture light is achieved via azimuthally structured diffractive structures in the entrance-side edge region RB1 of the lens element. As is evident from FIG. 5A, the light deflection structures LUS3 are designed as diffractive structures, which is to say as a diffraction grating, to be precise in the form of a blazed grating. Deviating from the variant in FIGS. 4A and 4B, however, eight substantially rectangular grating regions GB are provided in locally restricted fashion within the ring-shaped edge region RB1 only in those angular regions, respectively circumferentially offset through 45°, for which there is a contact zone or a holding element approximately centrally therebelow. Once again, the diffraction grating lines extend so as to be curved in the circumferential direction with a uniform radius of curvature, albeit not continuously in the circumferential direction but only over narrow angular ranges, for example with angular widths of between 10° and 30°.

The diffractive structures with a sawtooth-like cross section may be formed in one piece with the material of the lens element body and may be jointly manufactured with the latter. However a different procedure has been chosen in the exemplary case by virtue of the light deflection structures LUS3 being formed on separate optical light deflection elements LUE, which are manufactured separately from the transparent body of the optical element and are only fastened to the designated regions within the entrance-side edge region RB1 at the body of the optical element following its completion. Here, each of the light deflection elements LUE has a contact face on the side opposite to the light deflection structures, the design of the contact face being matched to the surface shape of the lens element body in the edge region such that reliable fastening is possible, for example directly by way of optical contact bonding without an auxiliary mechanism or with the aid of a thin adhesive layer or optical cement. In this way, even relatively complex distributions of light-deflecting properties in the edge region can be realized within the scope of relatively well-controllable manufacturing processes. Optionally, plane faces may also be worked into the edge region at the positions provided for the light deflection elements as these are particularly suitable for auxiliary mechanism-free contacting with plane faces at light deflection elements by way of optical contact bonding.

Figure 6B:
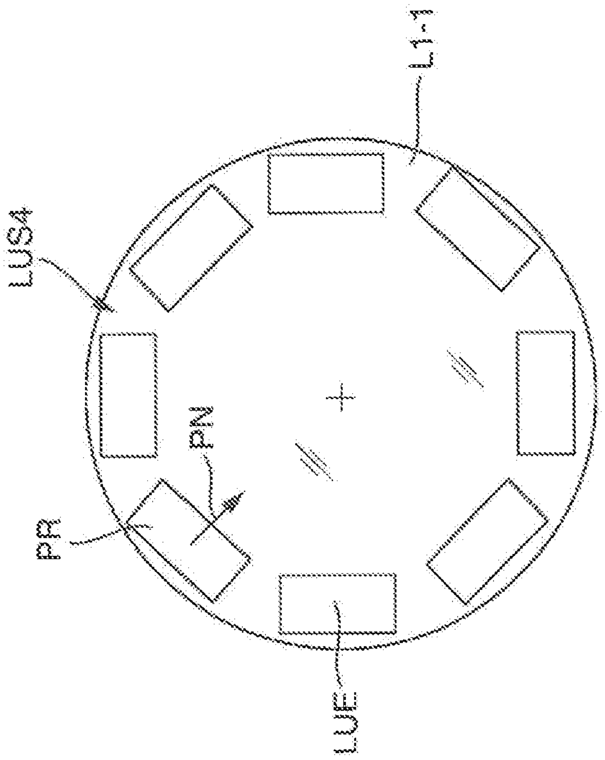
FIGS. 6A and 6B show a meridional section (FIG. 6A) and a plan view of the lens element top side (FIG. 6B) of an exemplary embodiment with, in the edge region, refractive light deflection structures which refract in the radial direction and are in the form of separately manufactured prisms.
Figure 6A:
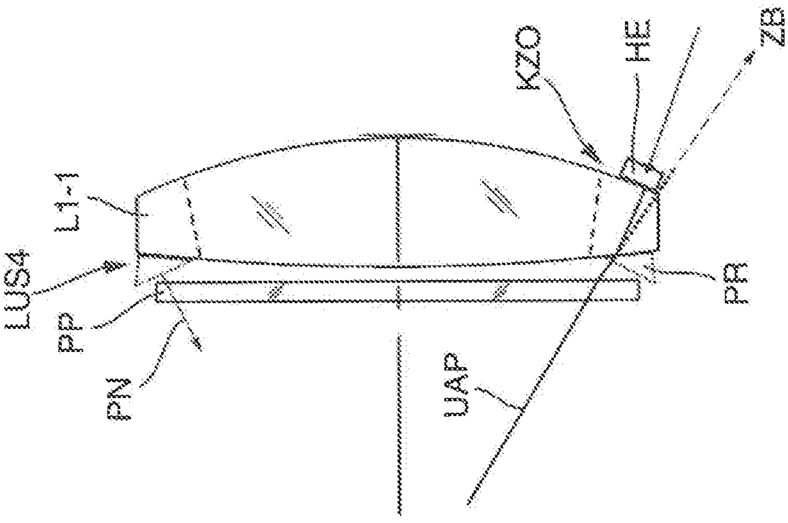

A variant for deflecting superaperture light with the aid of refractive light deflection structures in the forms of prisms PR in the edge region of a lens element is explained on the basis of FIGS. 6A and 6B. The form of representation is the same as in the previous examples. The plan view of the lens element top side in FIG. 6B shows that a total of eight light deflection elements LUE in the form of triangular prisms, which are distributed over the circumference with the same 45° angular division, are attached to the edge region RB1, with each adhesive position being assigned a prism. It is evident from the meridional section of FIG. 6A that the oblique prism surfaces with the normal directions PN are oriented inwards in the radial direction so that an outwards deflection of incident superaperture light in the radial direction is brought about. Similarly to the example of FIGS. 5A and 5B, the refractive light deflection structures designed as prisms are manufactured in the form of separate light deflection elements LUE which, following the completion of the lens element surface, are placed at appropriate positions in the edge region and are optically neutrally connected to the lens element body, for example by way of optical contact bonding or with the aid of an optical cement.

Figure 7B:
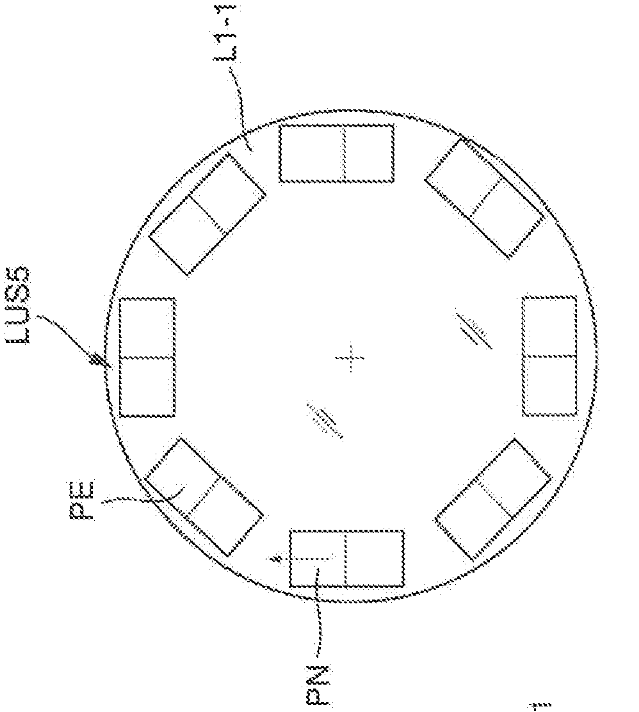
FIGS. 7A and 7B show a meridional section (FIG. 7A) and a plan view of the lens element top side (FIG. 7B) of an exemplary embodiment with, in the edge region, refractive light deflection structures which refract in the circumferential direction and are in the form of separately manufactured prisms.
Figure 7A:
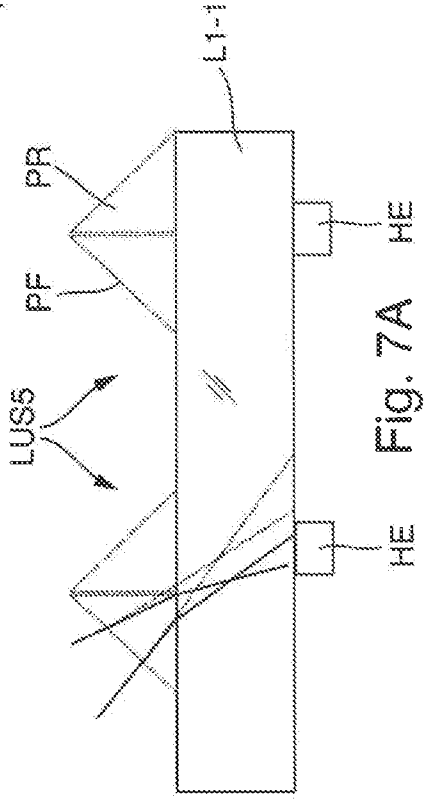

FIGS. 7A and 7B are used to explain another embodiment, in which the light deflection structures LUS5 are present in the form of prisms PR which, as separate prism elements, are initially manufactured separately from the lens element body and are then fastened at appropriate positions in the entrance-side edge region RB1 of the lens element by optical contact bonding or via optical cement. Deviating from the variant in FIGS. 6A and 6B, the prism faces PF in the beam path at an oblique angle for light deflection purposes are oriented with their surface normal PN not in the radial direction but in the circumferential direction (azimuthal direction). As evident from FIG. 7A, this also allows superaperture light to be deflected so that no superaperture light in the region is incident on the contact zones KZO to the holding elements.

Light deflection in the circumferential direction can also be achieved with the aid of diffractive structures. By way of example, the light deflection elements in FIGS. 5A and 5B may be designed so that the grating lines of the diffractive structures are aligned substantially in the radial direction. The basic concept consequently enables a large number of degrees of freedom in relation to the deflection angles and the direction in which the stray light is intended to be deflected. In other words, a target region may be located at clearly different positions within the projection lens.

In the previous examples, the light deflection structures are predominantly designed in the view of preventing superaperture light and other stray light from being incident on the light exit surface within certain regions, specifically, for example, wherever holding elements are provided and optionally wherever absorbing layers are present in the region of the contact zones. As a result, it is possible to protect the connection points between the holding elements and the lens elements from stray light-induced heating effects.

However, it is also possible to improve the performance of the projection lens by way of a targeted deflection of stray light into defined target regions, by virtue of certain components of the stray light intensity or the entire stray light intensity being deflected into a target region or into a plurality of target regions in order to heat a component part placed there in targeted fashion and hence to independently achieve a desired and predictable thermally induced manipulation within the optical system.

Figure 8B:
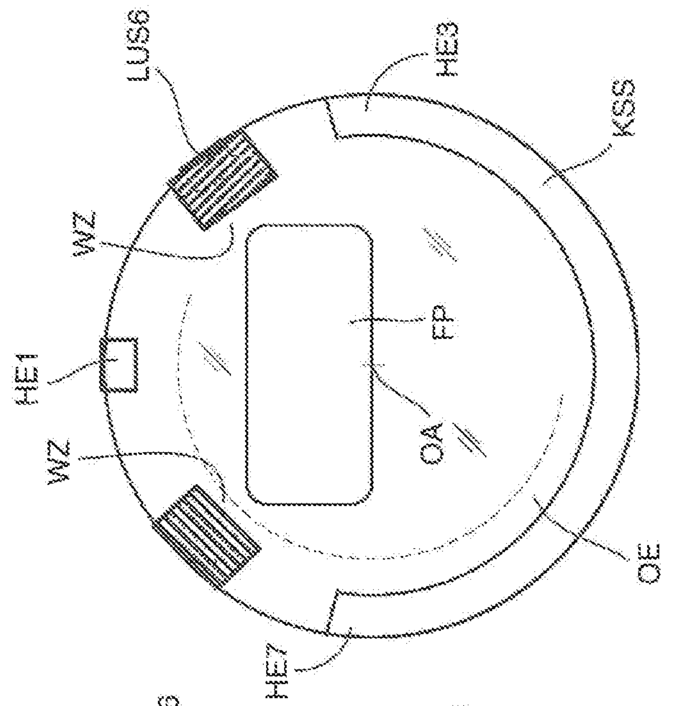
FIGS. 8A and 8B illustrate examples of thermal manipulators which operate with the aid of stray light that has been deflected in targeted fashion.
Figure 8A:
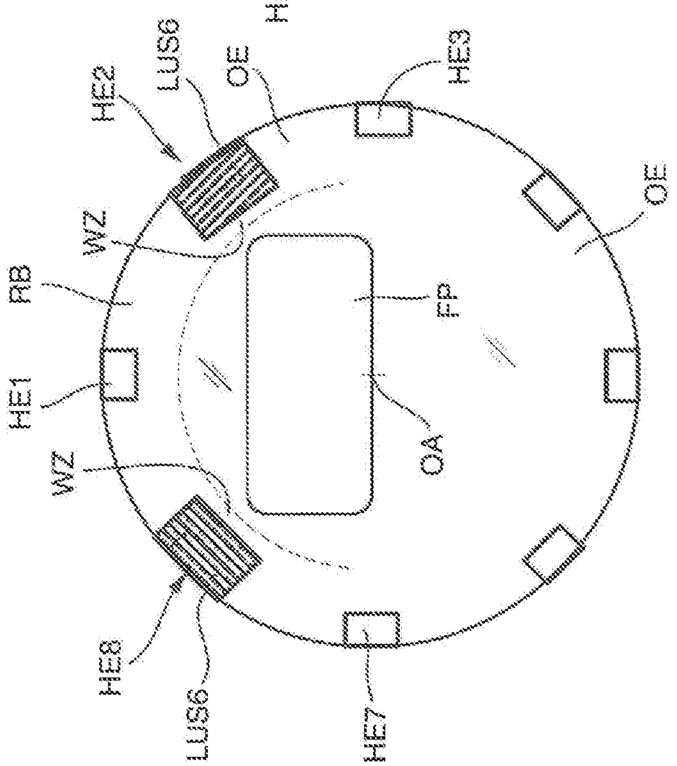

An example of a thermal manipulation with the aid of stray light deflected in a targeted fashion is explained on the basis of FIGS. 8A and 8B. Specifically, a thermal manipulator is created which independently brings about a certain homogenization or equalization of the temperature distribution within the optical element OE, for example a lens element, during operation. FIGS. 8A and 8B each show an axial plan view of a transparent optical element OE which is arranged optically in the vicinity of a field plane of a projection lens with an off-axis object field and image field (off-axis system). For example, the optical element can be the plane-parallel plate PP or the first lens element L1-1 of the projection lens of FIG. 2, or a lens element arranged in the vicinity of one of the intermediate images. The optical element is mounted in a holding device comprising eight holding elements HE1, HE2, etc. that are distributed uniformly over the circumference of the optical element, the edge region RB of the optical element being placed on the holding elements. The transparent optical element is securely connected to the holding elements via an adhesive layer that is protected by an adhesive protection layer.

On account of the near-field arrangement of the illustrated light entrance surface (first light passage surface LF1), the light propagating along the projection beam path produces an illuminated footprint FP on the lens element surfaces, the footprint having substantially the rectangular shape of the effective object field, with at least the corners being slightly rounded-off on account of the distance from the field plane. In the case of this illumination, which is asymmetric in relation to the optical axis OA, the passing projection light produces a non-rotationally symmetric, asymmetric temperature distribution within the optical element OA. If the temperature distribution in the edge region RB is considered, relatively warm zones WZ will be found wherever the corners of the illuminated field are closer to the edge of the optical element.

The stray light propagating outside of the imaging beam path is incident on the lens element in more or less the same way over the entire edge region. The contact zones of the holding elements HE1 and HE3 to HE7 are unprotected so that superaperture light is able to slightly heat the contact zones located there. In contrast thereto, the contact zones of the holding elements HE2 (at two o'clock) and HE8 (at ten o'clock) are protected from incident stray light via a light deflecting structure LUS6 formed on the light entrance side, with the result that the contact zones remain relatively colder in comparison with the contact zones of the other holding elements which are exposed to the stray light. The asymmetric heat distribution arising in the region of the footprint FP can be at least partly compensated for as a result of this non-uniform heat distribution in the circumferential direction of the heat arising due to stray light, and so the temperature distribution within the optical element OE is more uniform or better homogenized than in the case of the absence of the light deflection structures LUS5.

Diffractive light deflection structures LUS6 which deflect the stray light radially outwardly are used in the example. Similar effects can also be achieved using refractive light deflection structures and/or using light deflection structures which deflect the light in the circumferential direction.

FIG. 8B shows a modification of the arrangement of FIG. 8A, which is able to produce a different well-homogenized temperature distribution. In contrast to the example of FIG. 8A, an adhesive protection layer KSS which covers all holding elements HE3 to HE7 and the interposed regions in the circumferential direction and which is circumferential in the circumferential direction has been attached in the edge region RB to the light exit side, between this light exit side and the holding elements arranged there, in the example of FIG. 8B. If superaperture light is incident in this region, then the edge region is locally heated over the covered angular range (slightly more than) 180° on account of absorption of the stray light in the adhesive protection layer. In combination with the light-deflecting structures LUS6 in the region of the holding elements HE2 and HE8 closest to the footprint, this may lead to an even better homogenization of the temperature distribution within the optical element.

Figure 9:
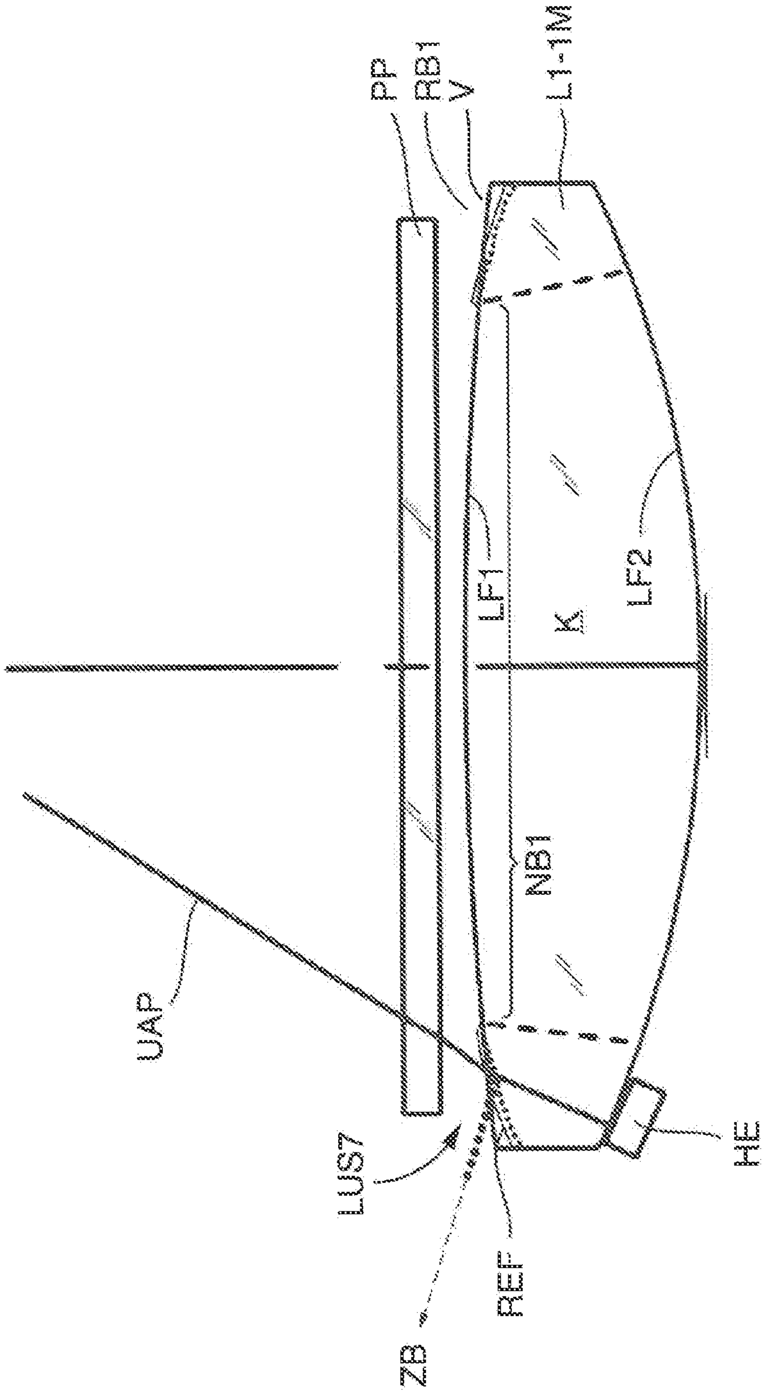
FIG. 9 shows an exemplary embodiment with reflective light deflection structures on a lens element surface slanting toward the edge.

The concept of the disclosure is not restricted to the use of refractive and/or diffractive light deflection structures. The provision of light deflection structures operating on reflective principles is also possible and advantageous in some cases. FIG. 9 schematically shows an example. The lens element L1-1M therein has an exit-side light passage surface LF2, the surface shape of which corresponds to the corresponding light exit surface in FIGS. 3A and 3B. In the used region NB1, the entrance-side light passage surface LF1 likewise has the same surface shape. Deviations in this respect are found in the edge region RB1 on the light entrance side. While the edge region specification in the exemplary embodiment of FIGS. 3A and 3B is chosen so that the light passage surface curves upwardly in the radial direction, which is to say towards the light entrance side, precisely the reverse is true in the variant of FIG. 9. In this case, the edge region specification is such that the edge region has significantly greater curvature in the radial direction than would be the case for an imagined extension V of the surface shape from the used region. In other words, an entrance face with a convex curvature is present in the used region and the adjoining edge region RB1 likewise has a convex curvature, albeit with a smaller radius of curvature. The ring-shaped edge region RB1 consequently has a design that slopes radially to the outside.

A single layer or multi-layer reflection coating (mirror coating) REF has been applied to the entire surface within the edge region RB1. If superaperture light UAP is incident on the reflective edge region, it is reflected backwards radially outwardly counter to the normal light propagation direction into a target region ZB which, as seen along the optical axis, is located upstream of the lens element, which is to say between the latter and the object plane. An absorber or any other light capturing structure is provided in this target region. In this way, the contact zone in the region of the holding element can also be protected against irradiation by way of superaperture light. In this variant, too, the concrete specification of the surface shape in the edge region via the edge region specification ensures that it is possible to precisely calculate how the surface design of the mirror surface is designed in order to deflect superaperture light from a known angle of incidence range exactly into a desired target region ZB.

Aspects of the disclosure were described above using the example of an optical imaging system in the form of a microlithographic projection lens. The disclosure is also usable in other optical systems, for example in an illumination system for constructing a microlithographic projection exposure apparatus. Issues on account of superaperture light may also arise in the illumination system, for example damage to an adhesive on account of the radiation load in combination with a lack of adhesive protection.

What is claimed is:

1. An optical element configured to be used in a holding device of an assembly of an optical system of a microlithographic projection exposure apparatus, the optical element comprising:

a body which is transparent to used light in a used wavelength range;

wherein:

the body comprises a first light passage surface and an opposing second light passage surface;

each of the first and second light passage surfaces comprises an optical used region and an edge region outside the optical used region;

the optical used region of each of the first and second light passage surfaces is configured to be disposed in a beam path of the used light in the optical system;

the edge region of each of the first and second light passage surfaces is configured to engage a holding element of the holding device;

the optical used region of each of the first and second light passage surfaces is of optical quality;

the optical used region of each of the first and second light passage surfaces comprises a surface shape configured in accordance with a used region specification specified by a function of the optical element in the beam path of the used light in the optical system;

the edge region of the first light passage surfaces comprises light deflection structures comprising a geometrically defined surface in accordance with an edge region specification which deviates from the used region specification, the geometrically defined surface being configured to deflect portions of light deflected by the light deflection structures into a target region outside of the beam path of the used light in the optical system; and a plurality of contact zones are distributed over a circumference of the edge region of the second light passage surface;

the light deflection structures to deflect portions of light into a target region outside of the contact zones; and at least one of the following conditions applies to the light deflection structures:

(i) for the first deflection surface, the edge region specification and the used region specification of are configured so that the surface shape of the used region in a transition region located outside of the used region in the edge region transitions smoothly into the surface shape of the edge region;

(ii) the first light passage surface has a continuously curved aspheric surface shape in the edge region in accordance with the edge region specification and a spherical surface shape or an aspherical surface shape in the optical used region in accordance with the used region specification;

(iii) the light deflection structures have, in an entire edge region of the first light passage surface, a continuously curved surface shape with a negative radius of curvature in at least one region; and (iv) within the edge region of the first light passage surface, there is an inflection point region with a transition from a positive radius of curvature on a side of the optical used region to a negative radius of curvature at a distance from the optical used region.

2. The optical element of claim 1, wherein the light deflection structures comprise refractive deflection structures.

3. The optical element of claim 2, wherein the light deflection structures comprise diffractive light deflection structures.

4. The optical element of claim 3, wherein the light deflection structures comprise reflective light deflection structures.

5. The optical element of claim 1, wherein the light deflection structures comprise diffractive light deflection structures.

6. The optical element of claim 5, wherein the light deflection structures comprise reflective light deflection structures.

7. The optical element of claim 1, wherein the light deflection structures comprise reflective light deflection structures.

8. The optical element of claim 1, wherein at least one of the following holds:

the light deflection structures comprise Fresnel lens rings;

the light deflection structures comprise a diffractive grating with a diffractive effect for the light of the used wavelength; and the light deflection structures comprise a blazed grating with a diffractive effect for the light of the used wavelength.

9. The optical element of claim 1, wherein the optical element has an optical axis, the surface shape of the optical used region is rotationally symmetric with respect to the optical axis, and the surface shape of the edge region is not rotationally symmetric with respect to the optical axis.

10. The optical element of claim 9, wherein the surface shape in the edge region comprises n-fold rotational symmetry with respect to the optical axis, where n is two, three, four or six.

11. The optical element of claim 1, wherein:

the light deflection structures are integral components of the optical element; and the light deflection structures are separate from the transparent body of the optical element and attached to the edge region.

12. The optical element of claim 1, wherein light deflection structures are configured based on calculations regarding a spatial distribution of a stray light intensity in the optical system for specified combinations of mask structures and illumination settings so that a thermally activated manipulator is configured to counteract and at least partly compensate disadvantageous effects of lens heating in the region of the used beam path.

13. An optical system, comprising:

an assembly, wherein the assembly comprises the optical element of claim 1.

14. The optical system of claim 13, wherein the optical system is a dioptric microlithographic imaging system or a catadioptric microlithographic imaging system.

15. An assembly, comprising:

an optical element; and a holding device configured to hold the optical element, wherein:

the optical element comprises a body which is transparent to used light in a used wavelength range;

the optical element comprises a first light passage surface and an opposing second light passage surface;

each of the first and second light passage surfaces comprises an optical used region in a beam path of the used light and an edge region outside the optical used region;

in the optical used region of each of the first and second light passage surfaces, the light passage surface is of optical quality in accordance with a specification surface shape specified by a function of the optical element in the beam path of the used light;

the holding device comprises holding elements engaging contact zones in the edge region of the second light passage surface;

the edge region of the first light passage surface comprises light deflection structures comprising a geometrically defined surface design; and the light deflection surfaces are configured to deflect portions of light into a target region outside of the contact zones.

16. The assembly of claim 15, wherein a surface shape of the light deflection structures is irregularly structured in the azimuthal direction so that a greatest density of light deflection structures are in a vicinity of an optically used footprint where the beam path of the used light intersects the first light passage surface.

17. The assembly of claim 16, wherein the target region comprises a material that has an absorptivity for the used light that is greater than an absorptivity of the transparent material of the optical element for the used light.

18. The assembly of claim 15, wherein the target region comprises a material that has an absorptivity for the used light that is greater than an absorptivity of the transparent material of the optical element for the used light.

19. An optical system, comprising:

the assembly of claim 15.

20. The optical system of claim 18, wherein the optical system is a dioptric microlithographic imaging system or a catadioptric microlithographic imaging system.

* * * * *